(12) United States Patent
Hirakata

(10) Patent No.: US 9,698,220 B2
(45) Date of Patent: Jul. 4, 2017

(54) SEMICONDUCTOR DEVICE

(71) Applicant: Sumitomo Electric Industries, Ltd., Osaka-shi (JP)

(72) Inventor: Noriyuki Hirakata, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/036,987

(22) PCT Filed: Sep. 30, 2014

(86) PCT No.: PCT/JP2014/076031
§ 371 (c)(1),
(2) Date: May 16, 2016

(87) PCT Pub. No.: WO2015/076020
PCT Pub. Date: May 28, 2015

(65) Prior Publication Data
US 2016/0308003 A1      Oct. 20, 2016

(30) Foreign Application Priority Data

Nov. 19, 2013   (JP) ................. 2013-238960

(51) Int. Cl.
*H01L 29/15*          (2006.01)
*H01L 31/0312*     (2006.01)
(Continued)

(52) U.S. Cl.
CPC ........ *H01L 29/0696* (2013.01); *H01L 21/046* (2013.01); *H01L 21/0485* (2013.01);
(Continued)

(58) Field of Classification Search
USPC ............ 257/77, E29.104, E29.297–E29.298, 257/E21.603, E21.605, E21.066, 330,
(Continued)

(56) References Cited

U.S. PATENT DOCUMENTS

| 2006/0220026 | A1 | 10/2006 | Uchida et al. |
| 2007/0176230 | A1 | 8/2007 | Uchida et al. |

(Continued)

FOREIGN PATENT DOCUMENTS

| JP | 2001-144288 A | 5/2001 |
| JP | 2005-183943 A | 7/2005 |
| WO | WO-2009/139140 A1 | 11/2009 |

OTHER PUBLICATIONS

International Search Report in PCT International Application No. PCT/JP2014/076031, dated Jan. 6, 2015.

*Primary Examiner* — Tram H Nguyen
(74) *Attorney, Agent, or Firm* — Venable LLP; Michael A. Sartori; F. Brock Riggs

(57) ABSTRACT

A MOSFET includes: a SiC layer including one main surface and provided with a plurality of contact regions; and a plurality of source electrodes formed in contact with the contact regions. In the MOSFET, in a plan view of the one main surface, a plurality of cells including the contact regions and the source electrodes are formed adjacent to one another, each of the plurality of cells having an outer circumferential shape that is a shape of hexagon including a long axis. According to the MOSFET, a contact resistance between each contact region and each source electrode can be further reduced, thereby attaining a more improved electrical property.

5 Claims, 7 Drawing Sheets

(51) Int. Cl.
*H01L 29/06* (2006.01)
*H01L 29/739* (2006.01)
*H01L 29/16* (2006.01)
*H01L 21/04* (2006.01)
*H01L 29/417* (2006.01)
*H01L 29/66* (2006.01)
*H01L 29/78* (2006.01)
*H01L 29/04* (2006.01)
*H01L 29/10* (2006.01)
*H01L 29/45* (2006.01)

(52) U.S. Cl.
CPC ........ *H01L 29/045* (2013.01); *H01L 29/1095* (2013.01); *H01L 29/1608* (2013.01); *H01L 29/41741* (2013.01); *H01L 29/45* (2013.01); *H01L 29/66068* (2013.01); *H01L 29/7395* (2013.01); *H01L 29/7802* (2013.01)

(58) Field of Classification Search
USPC ... 257/E29.313, 192, 76, E29.089, E29.136, 257/E29.198, E29.255, E29.256, 287, 257/328; 438/270, 142, 192, 286, 700; 326/38, 40, 41, 44, 45, 46
See application file for complete search history.

(56) References Cited

U.S. PATENT DOCUMENTS

| | | | |
|---|---|---|---|
| 2010/0193800 A1 | 8/2010 | Uchida et al. | |
| 2012/0228631 A1* | 9/2012 | Kono | H01L 29/4966 257/77 |
| 2012/0326166 A1* | 12/2012 | Masuda | H01L 21/049 257/77 |

* cited by examiner

SEMICONDUCTOR DEVICE

TECHNICAL FIELD

The present invention relates to a semiconductor device, more particularly, a semiconductor device excellent in electrical property.

BACKGROUND ART

Each of a MOSFET (Metal Oxide Semiconductor Field Effect Transistor) and an IGBT (Insulated Gate Bipolar Transistor) is a semiconductor device that controls conduction and interruption of current based on a predetermined threshold voltage. For example, Japanese Patent Laying-Open No. 2001-144288 (hereinafter, referred to as Patent Document 1) proposes a MOSFET using silicon carbide as its material. In this MOSFET, a p type base region (body region) having a hexagonal planar shape is formed within an n type epitaxial growth layer formed on a silicon carbide substrate, and an n type source region having a hexagonal planar shape is formed inwardly of the p type body region.

CITATION LIST

Patent Document

PTD 1: Japanese Patent Laying-Open No. 2001-144288

SUMMARY OF INVENTION

Technical Problem

In the MOSFET proposed in Patent Document 1, a p type contact region for fixing potential of the p type body region may be formed inwardly of the n type source region. This p type contact region is formed in contact with the p type body region so as to be connected to an electrode, thereby fixing the potential of the p type body region to the potential of the electrode.

However, since the p type contact region is formed inwardly of the n type source region, it is difficult to secure a wide area therefor. This makes it difficult to secure a wide contact area between the p type contact region and the electrode. Accordingly, a contact resistance between the p type contact region and the electrode becomes large, thus resulting in deterioration of electrical property of the MOSFET, disadvantageously.

The present invention has been made in view of the above problem, and has an object to provide a semiconductor device excellent in electrical property.

Solution to Problem

A semiconductor device according to the present invention includes: a semiconductor layer including one main surface and provided with a plurality of contact regions; and a plurality of electrode layers formed in contact with the contact regions. In the semiconductor device, in a plan view of the one main surface, a plurality of cells including the contact regions and the electrode layers are formed adjacent to one another, each of the plurality of cells having an outer circumferential shape that is a shape of hexagon including a long axis.

Advantageous Effects of Invention

According to the semiconductor device in accordance with the present invention, a semiconductor device excellent in electrical property can be provided.

DESCRIPTION OF EMBODIMENTS

Figure 1:
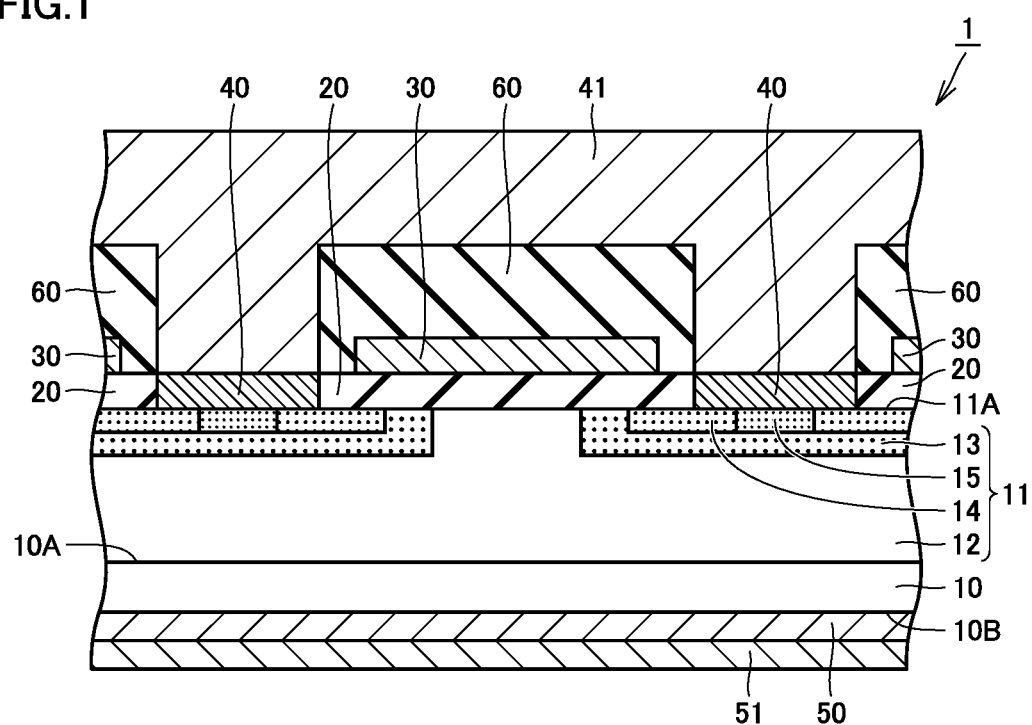
FIG. 1 is a cross sectional view schematically showing a structure of a semiconductor device according to a first embodiment.

Description of Embodiment of the Invention of the Present Application

First, embodiments of the present invention are listed and described.

(1) A semiconductor device (MOSFET 1) according to the present embodiment includes: a semiconductor layer (silicon carbide layer 11) including one main surface (11A) and provided with a plurality of contact regions (15); and a plurality of electrode layers (source electrodes 40) formed in contact with the contact regions (15). In the semiconductor device (MOSFET 1), in a plan view of the one main surface (11A), a plurality of cells (CL) including the contact regions (15) and the electrode layers (source electrodes 40) are formed adjacent to one another, each of the plurality of cells (CL) having an outer circumferential shape that is a shape of hexagon including a long axis.

In MOSFET 1, the plurality of cells (CL) each having the outer circumferential shape that is the shape of hexagon including the long axis are formed, and the cells (CL) include the contact regions (15) in contact with source electrodes 40. Hence, it is possible to secure a wider area for the contact regions (15) than that in the conventional semiconductor device, thereby further reducing contact resistances between the contact regions (15) and the source electrodes (40). Accordingly, according to MOSFET 1, a problem resulting from increase of the contact resistance can be suppressed, thereby attaining a more improved electrical property. Here, the expression "shape of hexagon including a long axis" is intended to indicate a shape obtained by extending a hexagon in a direction of an appropriate axis (direction of long axis), and the direction of axis is not limited particularly.

(2) Preferably in the semiconductor device (MOSFET 1), the outer circumferential shape of each of the cells (CL) is the shape of hexagon constituted of a pair of long sides (L) and short sides (S), the pair of long sides (L) extending along each other in a direction of the long axis, the short sides (S) connecting the pair of long sides (L) to each other.

Accordingly, the plurality of cells CL can be formed adjacent to one another such that their directions of long axes are along one another.

(3) Preferably in the semiconductor device (MOSFET 1), a ratio of a length of each of the long sides (L) to a length of each of the short sides (S) is not less than 1.2 and not more than 20 in the shape of hexagon constituting the outer circumferential shape of each of the cells (CL).

With the ratio of the lengths of the sides being not less than 1.2, the areas of contact regions 15 included in cells CL are sufficiently secured, thereby sufficiently reducing contact resistances between contact regions 15 and source electrodes 40. On the other hand, if the ratio of the lengths of the sides is more than 20, adhesion of a resist pattern may become deteriorated when forming contact regions 15. This makes it difficult to stably manufacture MOSFET 1. Thus, the ratio of the lengths of the sides is preferably not less than 1.2 and not more than 20, and is more preferably not less than 1.5 and not more than 10.

(4) Preferably in the semiconductor device (MOSFET 1), the semiconductor layer is composed of a wide band gap semiconductor.

A semiconductor device using the wide band gap semiconductor as its material is applied to, for example, a power semiconductor device or the like for controlling a large current, so that MOSFET 1 excellent in electrical property as described above is suitable.

Here, the term "wide band gap semiconductor" is intended to indicate a semiconductor having a larger band gap than that of silicon (Si), and includes silicon carbide (SiC), gallium nitride (GaN), diamond, or the like, for example.

(5) Preferably in the semiconductor device (MOSFET 1), the semiconductor layer is composed of silicon carbide. Moreover, the semiconductor layer is further provided with source regions (14) and body regions (13), the source regions (14) surrounding the respective contact regions (15) in the plan view of the one main surface (11A) and each having an outer circumferential shape that is geometrically similar to the shape of hexagon of each of the cells (CL), the body regions (13) surrounding the respective source regions (14) in the plan view of the one main surface (11A) and each having an outer circumferential shape that is geometrically similar to the shape of hexagon of each of the cells (CL). The cells (CL) further include the source regions (14) and the body regions (13). Sides constituting the shape of hexagon constituting the outer circumferential shape of each of the body regions (13), and sides constituting the shape of hexagon constituting the outer circumferential shape of each of the source regions (14) extend in a direction along a <1-100> direction of the silicon carbide.

Accordingly, during an operation of MOSFET 1, carriers are moved in a channel region within each body region 13 in a direction along a direction allowing for high mobility (<11-20> direction of silicon carbide). As a result, on resistance of MOSFET 1 can be reduced.

(6) Preferably in the semiconductor device (MOSFET 1), the electrode layers (source electrodes 40) are formed in contact with the contact regions (15) and the source regions (14). Each of the electrode layers (source electrodes 40) is composed of at least one material selected from a group consisting of nickel silicon and titanium aluminum silicon.

With source electrodes 40 being in contact with both contact regions 15 and source regions 14 and being composed of the above material, fine cells can be obtained while suppressing increase of contact resistance. In this case, however, a contact resistance between each contact region 15 and each source electrode 40 is relatively likely to be increased as compared with a contact resistance between source region 14 and source electrode 40. Hence, in this case, MOSFET 1 described above is suitable which can reduce the contact resistance with source electrode 40 by securing a wide area for contact region 15. It should be noted that in source electrode 40, at least part of the metal atoms (nickel, titanium, aluminum) are silicided to form nickel silicide and titanium aluminum silicide, and silicon atoms not reacted with the above metal atoms may exist.

Details of Embodiments of the Invention of the Present Application

Next, specific examples of the embodiments of the present invention will be described with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

Figure 2:
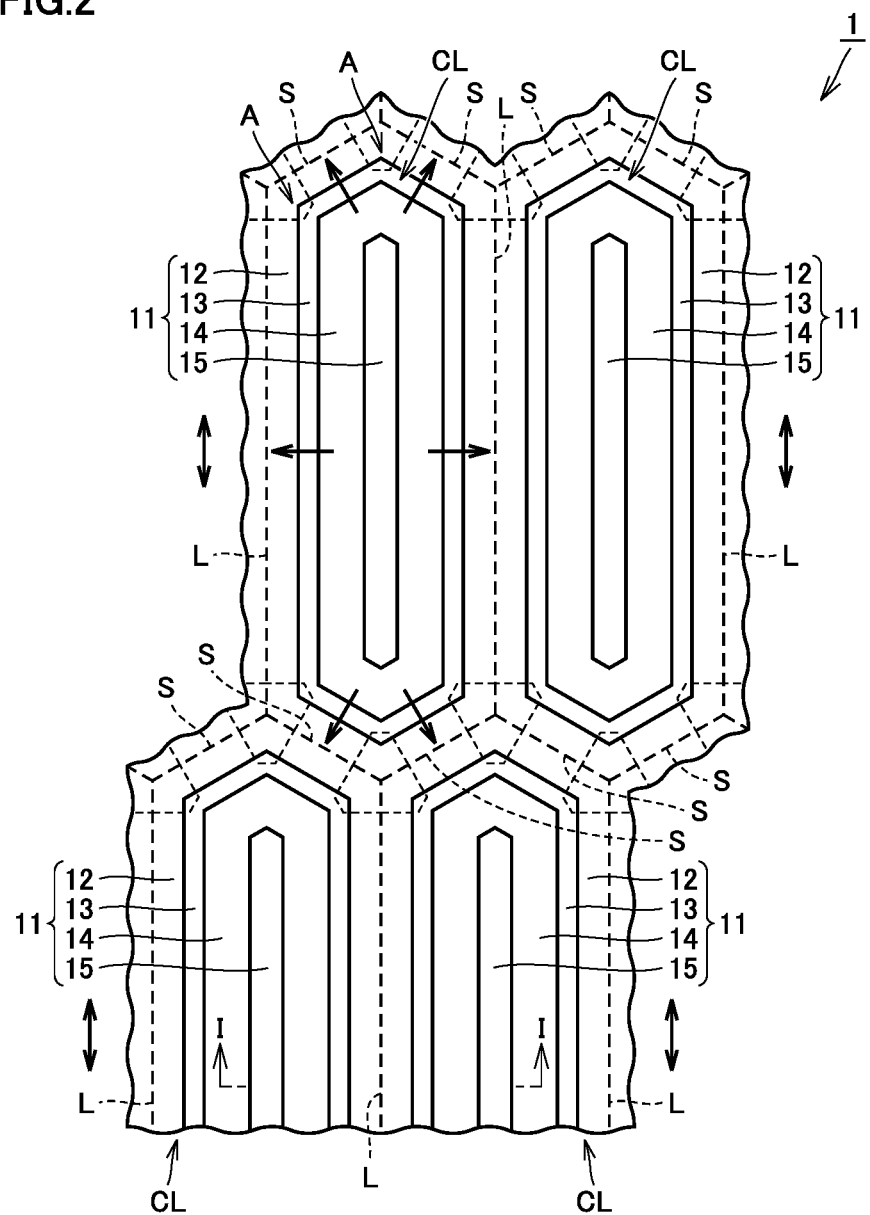
FIG. 2 is a plan view schematically showing the structure of the semiconductor device according to the first embodiment.

First, the following describes a structure of a semiconductor device according to a first embodiment, which is one embodiment of the present invention. FIG. 1 is a cross sectional view schematically showing a structure of a semiconductor device (MOSFET 1) according to the present embodiment. FIG. 2 is a plan view schematically showing the structure of MOSFET 1. FIG. 1 is a cross sectional view along a line segment I-I in FIG. 2. First, a cross sectional structure of MOSFET 1 will be described with reference to FIG. 1.

With reference to FIG. 1, MOSFET 1 is a planer type MOSFET, and mainly includes a silicon carbide (SiC) substrate 10, a silicon carbide (SiC) layer 11 (semiconductor layer), a gate oxide film 20, a gate electrode 30, source electrodes 40 (electrode layers), a drain electrode 50, a source interconnection 41, a backside pad electrode 51, and an interlayer insulating film 60. In SiC layer 11, a drift region 12, body regions 13, source regions 14, and contact regions 15 are formed.

SiC substrate 10 includes a main surface 10A and a main surface 10B opposite to main surface 10A. SiC substrate 10 contains an n type impurity such as nitrogen (N) and therefore has n type conductivity.

Drift region 12 is formed by epitaxial growth on main surface 10A. Drift region 12 contains an n type impurity such as nitrogen (N) and therefore has n type conductivity. The n type impurity concentration of drift region 12 is less than the n type impurity concentration of SiC substrate 10.

The plurality of body regions 13 are formed in SiC layer 11 to include a portion of main surface 11A of SiC layer 11. Each of body regions 13 contains a p type impurity such as aluminum (Al) or boron (B), and therefore has p type conductivity.

Source regions 14 are formed in respective body regions 13 to include a portion of main surface 11A. Each of source regions 14 contains an n type impurity such as phosphorus (P) and therefore has n type conductivity. The n type impurity concentration of source region 14 is more than the n type impurity concentration of drift region 12.

Contact regions 15 are formed adjacent to respective source regions 14 in body regions 13 to include a portion of main surface 11A. In SiC layer 11, the plurality of contact regions 15 are formed in contact with source electrodes 40. Each of contact regions 15 contains a p type impurity such as aluminum (Al) or boron (B), and therefore has p type conductivity. The p type impurity concentration of contact region 15 is larger than the p type impurity concentration of body region 13.

Gate oxide film 20 is formed in contact with a portion of main surface 11A. Gate oxide film 20 is composed of, for example, silicon dioxide ($SiO_2$) or the like, and is formed to extend from above one source region 14 to above the other source region 14.

Gate electrode 30 is formed in contact with gate oxide film 20. Gate electrode 30 is composed of a conductor such as polysilicon having an impurity added therein or aluminum (Al), and is formed to extend from above one source region 14 to above the other source region 14.

The plurality of source electrodes 40 are formed on and in contact with main surface 11A (source regions 14 and contact regions 15). Each of source electrodes 40 is composed of a material capable of attaining good electric contact (ohmic contact) with source region 14 and contact region 15, such as at least one material selected from a group consisting of $Ni_xSi_y$ (nickel silicon), $Ti_xSi_y$ (titanium silicon), $Al_xSi_y$ (aluminum silicon), and $Ti_xAl_ySi_z$ (titanium aluminum silicon) (x, y, z>0). In source electrode 40, a compound such as nickel silicide, titanium silicide, aluminum silicide, or titanium aluminum silicide may be formed as a result of silicidation of at least part of the metal atoms (nickel, titanium, aluminum).

Drain electrode 50 is formed on main surface 10B of SiC substrate 10. Drain electrode 50 is composed of, for example, the same material as that of source electrode 40, and is in ohmic contact with SiC substrate 10.

Next, the planar structure of MOSFET 1 will be described with reference to FIG. 2. FIG. 2 shows the structure of MOSFET 1 in a plan view of main surface 11A of SiC layer 11. It should be noted that FIG. 2 does not illustrate gate oxide film 20, gate electrode 30, source electrodes 40, source interconnection 41, and interlayer insulating film 60, each of which is formed on main surface 11A of SiC layer 11.

With reference to FIG. 2, in MOSFET 1, a plurality of cells CL each having an outer circumferential shape that is a shape of hexagon including a long axis in the plan view of main surface 11A are formed adjacent to and in contact with one another. Each of cells CL includes drift region 12, body region 13, source region 14, and contact region 15, each of which is formed in SiC layer 11, and further includes source electrode 40 (FIG. 1) formed in contact with contact region 15. Thus, cells CL are obtained by dividing MOSFET 1 into a plurality of pieces each having the outer circumferential shape that is the shape of hexagon including the long axis in the plan view of main surface 11A.

The outer circumferential shape of each cell CL is the shape of hexagon constituted of a pair of long sides L and short sides S connecting the pair of long sides L to each other. Long sides L extend along each other in the direction of long axis (direction indicated by a double-sided arrow in FIG. 2) of the shape of hexagon constituting the outer circumferential shape, specifically, extend in a <1-100> direction of SiC. The plurality of cells CL are formed in contact with one another at their long sides L and short sides S such that the directions in which their long sides L extend are along one another. A ratio of the length of each of long sides L to the length of each of short sides S is not less than 1.2 and not more than 20, and is preferably not less than 1.5 and not more than 10. For example, long side L has a length of 200 μm and short side S has a length of 10 μm. It should be noted that the direction of long axis of the shape of hexagon is not limited to the <1-100> direction and may be an appropriate direction such as a <11-20> direction, for example.

In the plan view of main surface 11A (FIG. 1), contact region 15 has an outer circumferential shape that is a shape of hexagon including a long axis and that is geometrically similar to the outer circumferential shape of cell CL. In the plan view of main surface 11A, source region 14 is formed to surround contact region 15 and have an outer circumferential shape that is a shape of hexagon including a long axis and that is geometrically similar to the outer circumferential shape of cell CL. In the plan view of main surface 11A, body region 13 is formed to surround contact region 15 and source region 14 and have an outer circumferential shape that is a shape of hexagon including a long axis and that is geometrically similar to the outer circumferential shape of cell CL.

Long sides L and short sides S constituting the shape of hexagon constituting the outer circumferential shape of cell CL extend in the <1-100> direction of SiC. As with cell CL, the sides constituting the shape of hexagon constituting the outer circumferential shape of each of body region 13, source region 14, and contact region 15 included in cell CL extend in the <1-100> direction of SiC. Accordingly, in a channel region within body region 13 (body region 13 below gate electrode 30), carriers are moved in a direction (direction indicated by a single-sided arrow in FIG. 2) along the <11-20> direction perpendicular to the <1-100> direction.

Next, the following describes an operation of MOSFET 1 according to the present embodiment. With reference to FIG. 1, when a voltage is applied between source electrode 40 and drain electrode 50 while an applied voltage to gate electrode 30 is lower than a threshold voltage, i.e., while it is in OFF state, a pn junction formed between body region 13 and drift region 12 is reverse-biased. Accordingly, MOSFET 1 is in the non-conductive state. On the other hand, when a voltage not less than the threshold voltage is applied to gate electrode 30, an inversion layer is formed in the channel region of body region 13 (body region 13 below gate electrode 30). As a result, source region 14 and drift region 12 are electrically connected to each other, whereby current flows between source electrode 40 and drain electrode 50. In the manner described above, MOSFET 1 operates.

Figure 9:
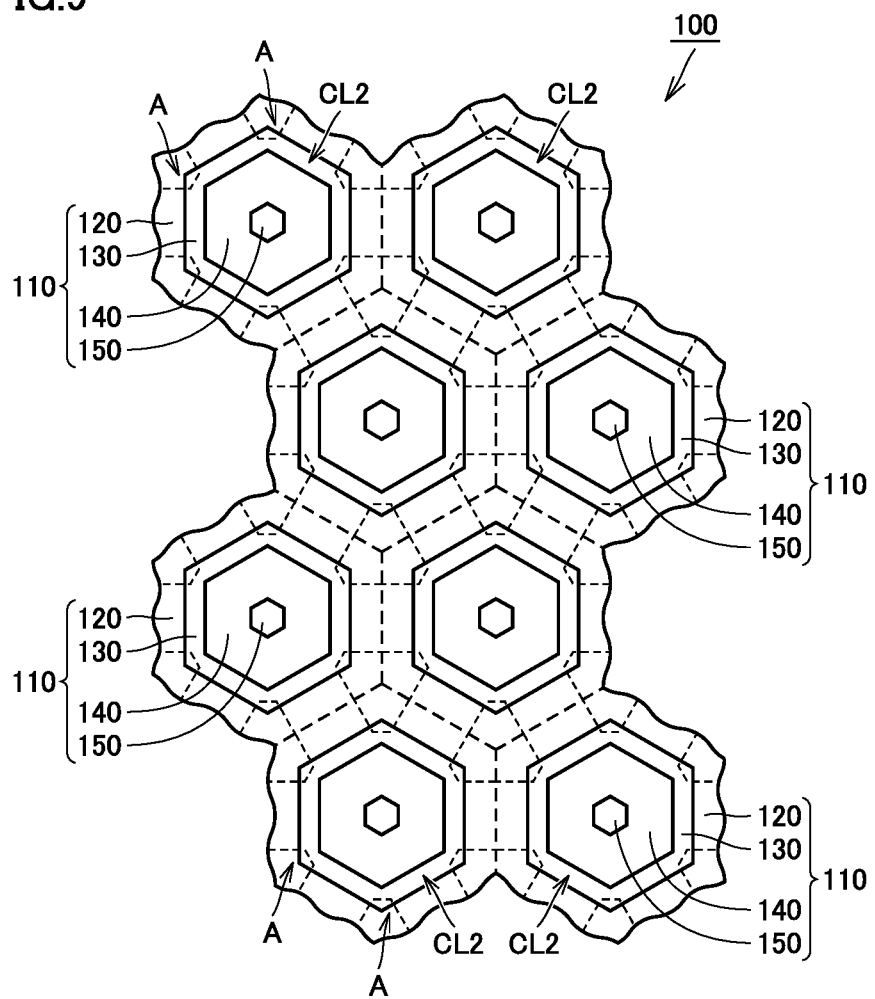
FIG. 9 is a plan view schematically showing a structure of a semiconductor device according to a comparative example.

Next, the following describes function and effect of MOSFET 1 according to the present embodiment with reference to a comparative example. FIG. 9 is a plan view schematically showing a structure of a MOSFET 100 according to the comparative example. In MOSFET 100, in a plan view of one main surface, a plurality of cells CL2 each having an outer circumferential shape that is a shape of right hexagon (shape of hexagon including no long axis) are formed adjacent to one another. Each of cells CL2 includes a drift region 120, a body region 130, a source region 140, and a contact region 150, each of which is formed in a SiC layer 110.

In MOSFET 1 according to the present embodiment, the plurality of cells CL each having the outer circumferential shape that is the shape of hexagon including the long axis are formed (FIG. 2), and each of cells CL includes contact region 15 in contact with source electrode 40 (FIG. 1 and FIG. 2). This makes it possible to secure a wider area for the contact region than that in MOSFET 100 according to the comparative example, thereby further reducing a contact resistance between contact region 15 and source electrode 40. Accordingly, according to MOSFET 1 in accordance with the present embodiment, occurrence of a problem resulting from increase of the contact resistance can be suppressed, thereby attaining a more improved electrical property.

With reference to FIG. 2 and FIG. 9, in MOSFET 1 according to the present embodiment, the respective areas of regions A, each of which contributes to substantially no device operation, in the main surface are smaller than those in MOSFET 100 according to the comparative example. Accordingly, in MOSFET 1 according to the present embodiment, a drain-gate capacitance can be further reduced as compared with MOSFET 100 according to the comparative example.

In MOSFET 1, the outer circumferential shape of cell CL is the shape of hexagon constituted of the pair of long sides L and short sides S, the pair of long sides L extending along each other in the direction of long axis, short sides S connecting the pair of long sides L to each other. Accordingly, as shown in FIG. 2, the plurality of cells CL can be formed adjacent to one another such that their directions of long axes are along one another.

In the shape of hexagon constituting the outer circumferential shape of cell CL in MOSFET 1, the ratio of the length of each of long sides L to the length of each of short sides S is not less than 1.2 and not more than 20. With the ratio of the lengths of the sides being not less than 1.2, the area of contact region 15 included in cell CL is sufficiently secured, thereby sufficiently reducing a contact resistance between contact region 15 and source electrode 40. On the other hand, if the ratio of the lengths of the sides is more than 20, adhesion of a resist pattern may become deteriorated when forming contact region 15. This makes it difficult to stably manufacture MOSFET 1. Accordingly, the ratio of the lengths of the sides is preferably not less than 1.2 and not more than 20.

Although it has been illustrated that the semiconductor layer is composed of silicon carbide (the semiconductor layer is SiC layer 11) in MOSFET 1, the present invention is not limited to this. The semiconductor layer may be composed of a wide band gap semiconductor such as gallium nitride or diamond. Since a large current is controlled in a MOSFET employing such a wide band gap semiconductor as its material, MOSFET 1 excellent in electrical property as described above is suitable.

In SiC layer 11 of MOSFET 1, source region 14 is formed to surround contact region 15 in the plan view of main surface 11A and have the outer circumferential shape that is geometrically similar to the shape of hexagon of cell CL, and body region 13 is formed to surround source region 14 in the plan view of main surface 11A and have the outer circumferential shape that is geometrically similar to the shape of hexagon of cell CL. Cell CL includes source region 14 and body region 13. The sides constituting the shape of hexagon constituting the outer circumferential shape of body region 13, and the sides constituting the shape of hexagon constituting the outer circumferential shape of source region 14 extend in the direction along the <1-100> direction of silicon carbide.

Accordingly, during an operation of MOSFET 1, carriers can be moved in the channel region in a direction along a direction allowing for high mobility (the <11-20> direction of SiC). As a result, on resistance of MOSFET 1 can be reduced.

In MOSFET 1, source electrode 40 is formed in contact with contact region 15 and source region 14. Source electrode 40 is composed of a material selected from a group consisting of nickel silicon, titanium silicon, aluminum silicon, and titanium aluminum silicon.

With source electrode 40 being in contact with both contact region 15 and source region 14 and being composed of the above material, fine cells can be obtained while suppressing increase of contact resistance. In this case, however, a contact resistance between contact region 15 and source electrode 40 is relatively likely to be increased as compared with a contact resistance between source region 14 and source electrode 40. Hence, in this case, MOSFET 1 described above is suitable which can reduce the contact resistance with source electrode 40 by securing a wide area for contact region 15.

Figure 3:
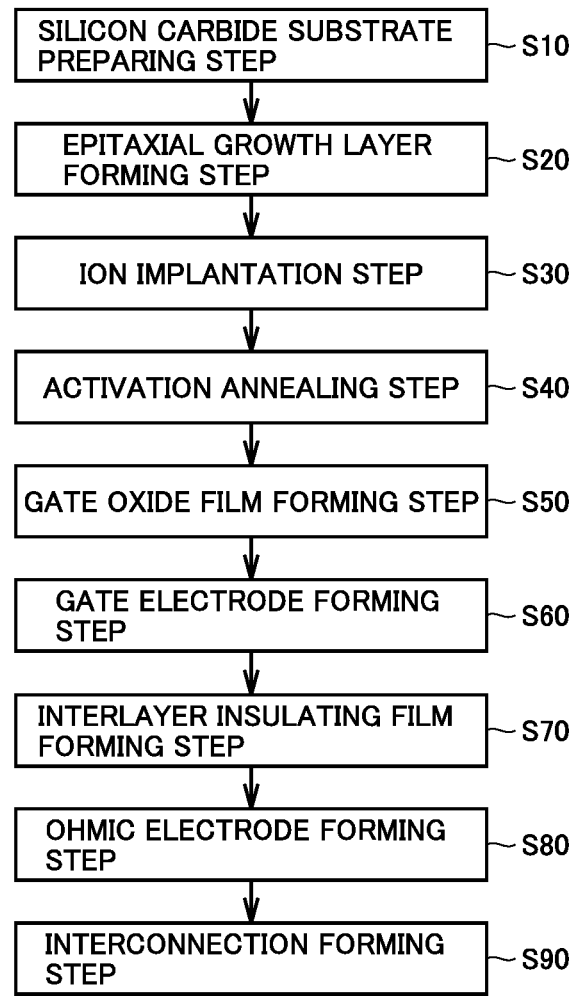
FIG. 3 is a flowchart schematically showing a method for manufacturing the semiconductor device according to the first embodiment.
Figure 4:
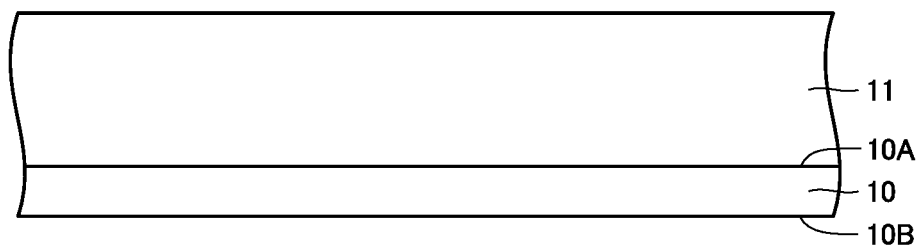
FIG. 4 is a schematic view for illustrating steps (S10) and (S20) in the method for manufacturing the semiconductor device according to the first embodiment.

Next, the following describes a method for manufacturing a semiconductor device (MOSFET 1) according to the present embodiment. With reference to FIG. 3, in the method for manufacturing the semiconductor device according to the present embodiment, a silicon carbide substrate preparing step is first performed as a step (S10). With reference to FIG. 4, in this step (S10), SiC substrate 10 having main surfaces 10A, 10B is prepared by cutting an ingot (not shown) composed of 4H—SiC, for example.

Next, as a step (S20), an epitaxial growth layer forming step is performed. With reference to FIG. 4, in this step (S20), SiC layer 11 is formed by epitaxial growth on main surface 10A of SiC substrate 10.

Figure 5:
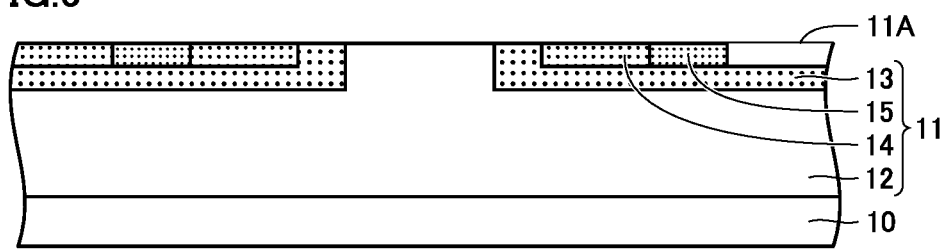
FIG. 5 is a schematic view for illustrating steps (S30) and (S40) in the method for manufacturing the semiconductor device according to the first embodiment.

Next, an ion implantation step is performed as a step (S30). With reference to FIG. 5, in this step (S30), first, for example, aluminum (Al) ions are implanted into SiC layer 11 from the main surface 11A side, thereby forming body region 13 in SiC layer 11. Next, for example, phosphorus (P) ions are implanted into body region 13, thereby forming source region 14 in body region 13. Next, for example, aluminum (Al) ions are implanted into body region 13, thereby forming contact region 15 adjacent to source region 14 in body region 13. Further, in SiC layer 11, a region in which none of body region 13, source region 14, and contact region 15 is formed serves as drift region 12. Accordingly, in SiC layer 11, as shown in FIG. 2, contact region 15 is formed to have the outer circumferential shape constituted of the shape of hexagon including the long axis, source region 14 is formed to surround contact region 15 and have the outer circumferential shape constituted of the shape of hexagon including the long axis, and body region 13 is formed to surround source region 14 and contact region 15 and have the outer circumferential shape constituted of the shape of hexagon including the long axis.

Next, an activation annealing step is performed as a step (S40). With reference to FIG. 5, in this step (S40), SiC substrate 10 having SiC layer 11 formed thereon is heated, thereby activating the impurities implanted in SiC layer 11. In this way, desired carriers are generated in the impurity regions of SiC layer 11.

Figure 6:
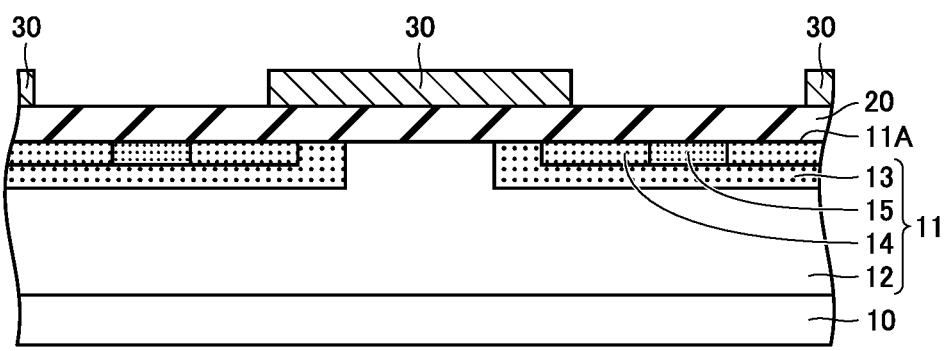
FIG. 6 is a schematic view for illustrating steps (S50) and (S60) in the method for manufacturing the semiconductor device according to the first embodiment.

Next, a gate oxide film forming step is performed as a step (S50). With reference to FIG. 6, in this step (S50), SiC substrate 10 having SiC layer 11 formed thereon is heated in an atmosphere including, for example, oxygen ($O_2$), thereby forming gate oxide film 20 composed of silicon dioxide ($SiO_2$) on main surface 11A.

Next, as a step (S60), a gate electrode forming step is performed. In this step (S60), with reference to FIG. 6, for example, an LPCVD (Low Pressure Chemical Vapor Deposition) method is employed to form gate electrode 30, which is composed of polysilicon, on and in contact with gate insulating film 20.

Figure 7:
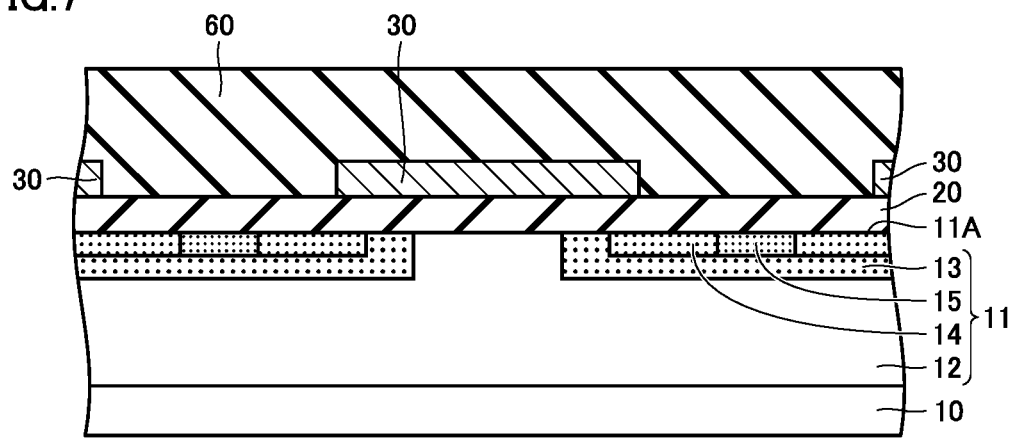
FIG. 7 is a schematic view for illustrating a step (S70) in the method for manufacturing the semiconductor device according to the first embodiment.

Next, an interlayer insulating film forming step is performed as a step (S70). In this step (S70), with reference to FIG. 7, interlayer insulating film 60 composed of $SiO_2$ is formed by, for example, a CVD method such that interlayer insulating film 21 and gate oxide film 20 surround gate electrode 30.

Figure 8:
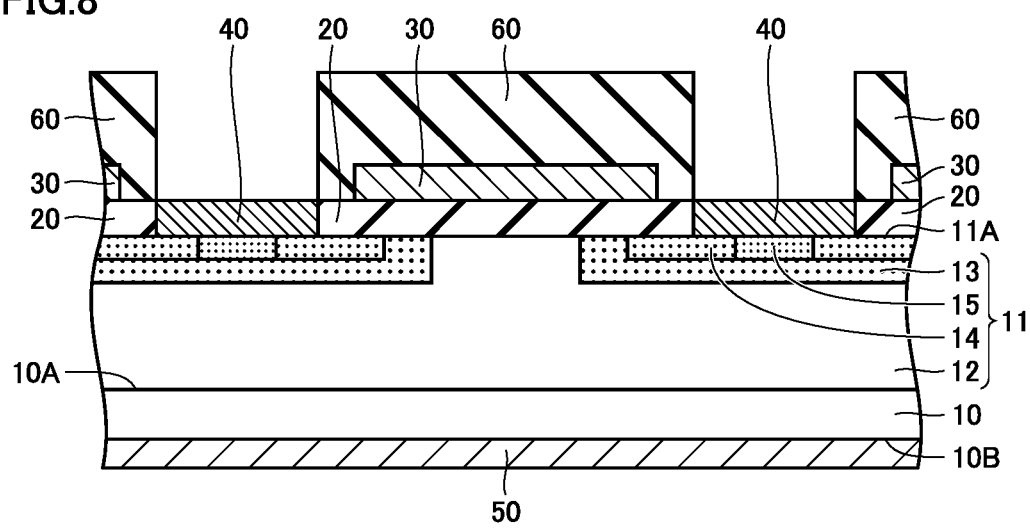
FIG. 8 is a schematic view for illustrating a step (S80) in the method for manufacturing the semiconductor device according to the first embodiment.

Next, an ohmic electrode forming step is performed as a step (S80). In this step (S80), with reference to FIG. 8, gate oxide film 20 and interlayer insulating film 60 are first removed by etching from a region in which source electrode 40 is to be formed. This leads to formation of a region in which source region 14 and contact region 15 are exposed. Then, in this region, a film made of, for example, nickel (Ni) is formed. On the other hand, a film made of, for example, Ni is formed on main surface 10B of SiC substrate 10. Then, SiC substrate 10 is heated, thereby siliciding at least portions of the films made of Ni. Accordingly, on main surface 11A of SiC layer 11 and main surface 10B of SiC substrate 10, source electrode 40 and drain electrode 50 are formed respectively.

Next, an interconnection forming step is performed as a step (S90). With reference to FIG. 1, in this step (S90), for example, source interconnection 41, which is composed of a conductor such as aluminum (Al) or gold (Au), is formed using a deposition method to cover source electrode 40 and interlayer insulating film 60. Moreover, as with source interconnection 41, backside pad electrode 51, which is composed of aluminum (Al), gold (Au), or the like, is formed to cover drain electrode 50. By performing the steps (S10) to (S90), MOSFET 1 is manufactured, thus completing the method for manufacturing the semiconductor device in the present embodiment.

Second Embodiment

Next, the following describes a second embodiment, which is another embodiment of the present invention. The semiconductor device (MOSFET 2) according to the present embodiment has basically the same configuration and exhibit basically the same effect as those of MOSFET 1 according to the first embodiment. However, MOSFET 2 according to the present embodiment differs from MOSFET 1 in terms of configurations of the impurity regions formed in the SiC layer.

Figure 10:
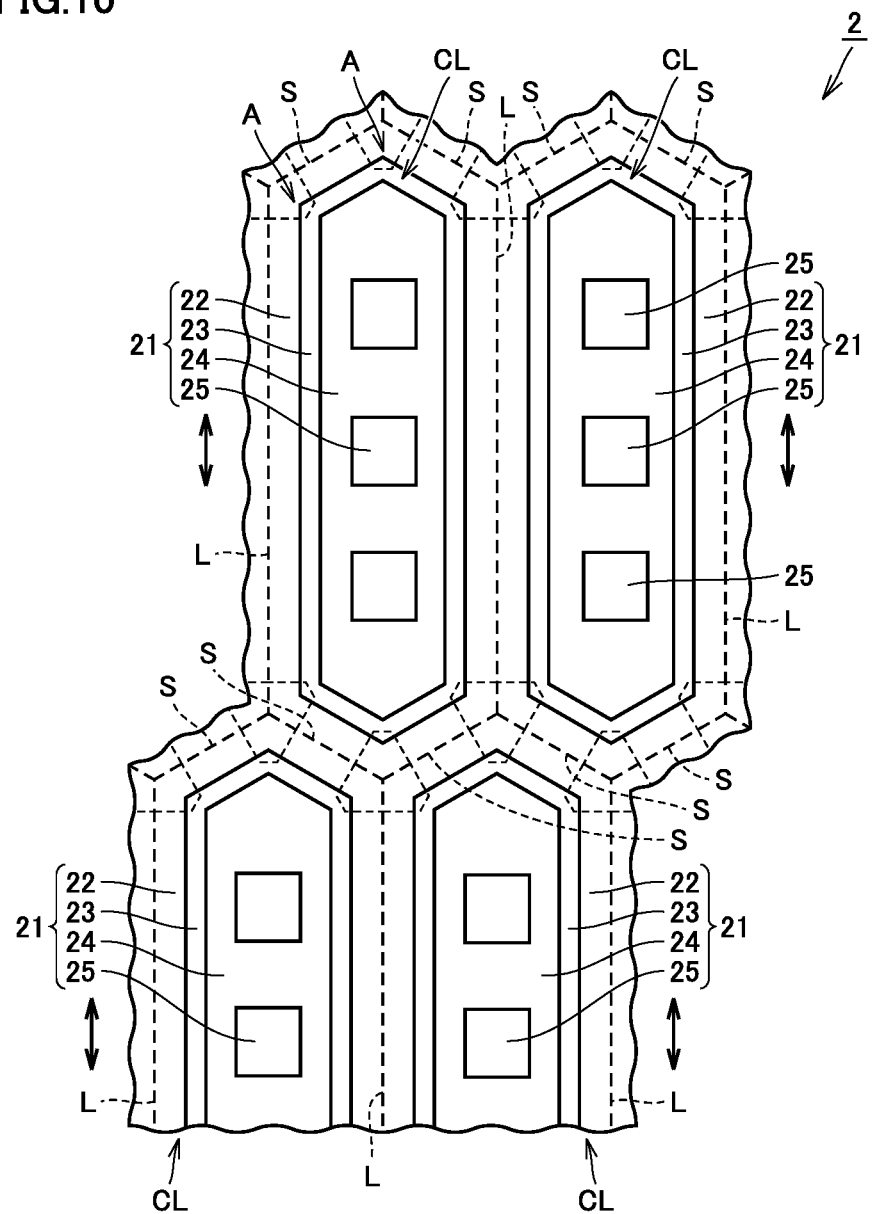
FIG. 10 is a plan view schematically showing a structure of a semiconductor device according to a second embodiment.

Hereinafter, a planar structure of MOSFET 2 will be described with reference to FIG. 10. As with FIG. 2, FIG. 10 shows the structure of MOSFET 2 in a plan view of a main surface of a SiC layer 21. With reference to FIG. 10, as with MOSFET 1, in MOSFET 2, a plurality of cells CL each having an outer circumferential shape that is a shape of hexagon including a long axis in the plan view of the main surface of SiC layer 21 are formed adjacent to and in contact with one another. Each of cells CL includes a drift region 22, a body region 23, a source region 24, and contact regions 25, each of which is formed in SiC layer 21, and includes a source electrode (not shown) formed in contact with contact regions 25.

Source region 24 is formed to have an outer circumferential shape that is constituted of a shape of hexagon including a long axis and that is geometrically similar to the outer circumferential shape of cell CL, and is formed to be surrounded by body region 23 in the plan view. The plurality of contact regions 25 are each formed to have an outer circumferential shape constituted of, for example, a shape of quadrangle and are each formed to be surrounded by source region 24 in the plan view. The plurality of contact regions 25 are formed with a space (equal space) therebetween in the direction of long axis of the shape of hexagon constituting the outer circumferential shape of cell CL. The number of contact regions 25 formed may be three in each cell CL as shown in FIG. 10, but is not particularly limited. Moreover, the outer circumferential shape of contact region 25 may be the shape of quadrangle as shown in FIG. 10, but is not limited particularly and may be a different shape.

Thus, in MOSFET 2 according to the present embodiment, in source region 24, the plurality of contact regions 25 are formed side by side with the space therebetween. Accordingly, a source electrode can be more facilitated to be brought into contact with source region 24 and contact regions 25 as compared with MOSFET 1 according to the first embodiment. For example, even if there is a variation in the lateral width of a source electrode (width in the direction of short axis of the shape of hexagon), contact with source region 24 and contact regions 25 can be readily secured. Thus, MOSFET 2 can be designed such that the source electrode has a narrowed lateral width, with the result that a design with reduced cell pitch can be facilitated.

It should be noted that although the vertical, planer type MOSFET has been illustrated as an example in the present embodiment, the present invention is not limited to this. For the semiconductor device according to the present embodiment, it is possible to also employ a modification such as a trench type MOSFET or an IGBT, for example.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The semiconductor device of the present invention can be applied particularly advantageously to a semiconductor device required to improve an electrical property.

REFERENCE SIGNS LIST 1, 2, 100: MOSFET; 10: silicon carbide (SiC) substrate; 10A, 10B, 11A: main surface; 11, 21: silicon carbide (SiC) layer; 12, 22, 120: drift region; 13, 23, 130: body region; 14, 24, 140: source region; 15, 25, 150: contact region; 20: gate oxide film; 30: gate electrode; 40: source electrode; 41: source interconnection; 50: drain electrode; 51: backside pad electrode; 60: interlayer insulating film; A: region; CL, CL2: cell; L, L1, L2: long side; S, S1, S2, S3, S4: short side.

The invention claimed is:
1. A semiconductor device comprising:
a semiconductor layer including one main surface and provided with a plurality of contact regions; and a plurality of electrode layers formed in contact with the contact regions, in a plan view of the one main surface, a plurality of cells including the contact regions and the electrode layers being formed adjacent to one another, each of the plurality of cells having an outer circumferential shape that is a shape of hexagon including a long axis, wherein the outer circumferential shape is the shape of hexagon constituted of a pair of long sides and short sides, the pair of long sides extending along each other in a direction of the long axis, the short sides connecting the pair of long sides to each other.

2. The semiconductor device according to claim 1, wherein a ratio of a length of each of the long sides to a length of each of the short sides is not less than 1.2 and not more than 20.

3. The semiconductor device according to claim 1, wherein the semiconductor layer is composed of a wide band gap semiconductor.

4. The semiconductor device according to claim 1, wherein
the semiconductor layer is composed of silicon carbide,
the semiconductor layer is further provided with source regions and body regions, the source regions surrounding the respective contact regions in the plan view of the one main surface and each having an outer circumferential shape that is geometrically similar to the shape of hexagon, the body regions surrounding the respective source regions in the plan view of the one main surface and each having an outer circumferential shape that is geometrically similar to the shape of hexagon,
the cells further include the source regions and the body regions, and
sides constituting the shape of hexagon constituting the outer circumferential shape of each of the body regions, and sides constituting the shape of hexagon constituting the outer circumferential shape of each of the source regions extend in a direction along a <1-100> direction of the silicon carbide.

5. The semiconductor device according to claim 4, wherein
the electrode layers are formed in contact with the contact regions and the source regions, and
each of the electrode layers is composed of at least one material selected from a group consisting of nickel silicon and titanium aluminum silicon.

* * * * *